(12) United States Patent
Zhang et al.

(10) Patent No.: US 9,404,780 B2
(45) Date of Patent: Aug. 2, 2016

(54) ELECTROMAGNETIC FLOW METER, MISWIRING DETECTION APPARATUS AND MISWIRING DETECTION METHOD

(71) Applicant: YOKOGAWA ELECTRIC CORPORATION, Musashino-shi, Tokyo (JP)

(72) Inventors: Hong Yan Zhang, Musashino (JP); Toru Yan Shimura, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 4 days.

(21) Appl. No.: 14/629,723

(22) Filed: Feb. 24, 2015

(65) Prior Publication Data

US 2015/0241255 A1     Aug. 27, 2015

(30) Foreign Application Priority Data

Feb. 25, 2014   (JP) ................................. 2014-034024

(51) Int. Cl.
　　*G01F 1/58*　　(2006.01)
　　*G01F 25/00*　　(2006.01)
　　*G01R 31/04*　　(2006.01)

(52) U.S. Cl.
CPC　*G01F 1/584* (2013.01); *G01F 1/58* (2013.01); *G01F 25/0007* (2013.01); *G01R 31/041* (2013.01)

(58) Field of Classification Search
None
See application file for complete search history.

(56) References Cited

U.S. PATENT DOCUMENTS

2013/0289897 A1    10/2013   Yamaguchi et al.

FOREIGN PATENT DOCUMENTS

JP          2013-257276 A        12/2013

OTHER PUBLICATIONS

Extended European Search Report issued on Oct. 30, 2015, by the European Patent Office in counterpart European Application No. 15156183.4.

*Primary Examiner* — Harshad R Patel
(74) *Attorney, Agent, or Firm* — Sughrue Mion, PLLC

(57) ABSTRACT

An electromagnetic flow meter includes a converter including an excitation unit configured to generate and output an excitation signal and a flow rate signal receiving unit configured receive a flow rate signal, a flowtube including a coil connected to the excitation unit through an excitation cable and an electrode connected to the flow rate signal receiving unit through a signal cable, and a miswiring detection unit configured to enable the excitation unit to output an excitation signal of a first frequency and to calculate a first index value relating to the first frequency and a second index value relating to a second frequency from a flow rate signal acquired when the excitation signal of the first frequency is output. The miswiring detection unit determines that a miswiring occurs when the first index value is not large enough to satisfy a predetermined criterion than the second index value.

8 Claims, 20 Drawing Sheets

EXCITATION SIGNAL OF FIRST FREQUENCY

FLOW RATE SIGNAL

STOP EXCITATION SIGNAL

FLOW RATE SIGNAL

# ELECTROMAGNETIC FLOW METER, MISWIRING DETECTION APPARATUS AND MISWIRING DETECTION METHOD

CROSS-REFERENCE TO RELATED APPLICATION

The present application claims priority from Japanese Patent Application No. 2014-034024 filed on Feb. 25, 2014, the entire content of which is incorporated herein by reference.

BACKGROUND

1. Technical Field

The present invention relates an electromagnetic flow meter having a converter and a flowtube, and more particularly, to a technology of detecting a miswiring between the converter and the flow/tube.

2. Related Art

Since an electromagnetic flow meter configured to measure a flow rate of conductive fluid by using electromagnetic induction is robust and has high precision, it is widely used for an industrial use. The electromagnetic flow meter is configured to enable conductive fluid to be measured to flow into a measurement tube, to which a magnetic field is applied in an orthogonal direction, and to measure a generated electromotive force. Since the electromotive force is proportional to a flow rate of the fluid to be measured, it is possible to obtain a volumetric flow rate of the fluid to be measured on the basis of the measured electromotive force.

FIG. 15 is a block diagram showing a configuration of an electromagnetic flow meter of the related art. As shown in FIG. 15, the electromagnetic flow meter 50 has a converter 500 and a flowtube 530.

The converter 500 has an excitation unit 501 configured to generate and output an excitation signal, a flow rate signal receiving unit 502 configured receive a flow rate signal, a flow rate calculation unit 503 configured to calculate a flow rate on the basis of the flow rate signal and an output unit 504 configured to display a measurement result and the like and to transmit the same to another apparatus.

The flowtube 530 has a core 531 around which a coil 532 is wound, a pair of detection electrodes 533 mounted to a piping 300 and an earth electrode 534.

The excitation signal output from the excitation unit 501 is input to the coil 532 through an excitation cable 541, and the flow rate signals from the detection electrodes 533 and earth electrode 534 are input to the flow rate signal receiving unit 502 through a signal cable 542.

For example, when newly mounting the electromagnetic flow meter 50 to the piping 300 or re-mounting the electromagnetic flow meter 50 demounted for maintenance and the like, a corresponding operation is generally performed in accordance with a sequence shown in FIG. 16. That is, the flowtube 530 is mounted to the piping 300 and the converter 500 is mounted at a predetermined mounting place (S11). Then, the excitation cable 541 and signal cable 542 configured to connect the flowtube 530 and the converter 500 each other are wired (S12).

A zero adjustment is performed before actually starting an operation. The zero adjustment is performed at a state where the piping 300 is filled with water (S13) and there is no flow (S14). When the zero adjustment is finished, the fluid to be measured in the piping 300 is enabled to flow at a normal state and the operation actually starts (S15).

[Patent Document 1] Japanese Patent Application Publication No. 2013-257276A

It is not necessarily required that the mounting place of the flowtube 530 and the mounting place of the converter 500 should be close to each other. Also, a plurality of electromagnetic flow meters is mounted in the neighborhood in many cases. For this reason, as shown in FIG. 17, originally, a converter A 500a and a flowtube A 530a should be connected to each other by an excitation cable and a signal cable and a converter B 500b and a flowtube B 530b should be connected to each other by an excitation cable and a signal cable. At this time, a miswiring may occur.

As aspects of the miswiring, for example, as shown in FIG. 18A, the signal cable of the converter A 500a may be connected to the flowtube B 530b. At this time, as shown in FIG. 18B, when the flowtube B 530b is connected to the converter B 500b by the excitation cable, the flow rate signal detected by the flowtube B 530b may be input to the converter A 500a.

Also, as shown in FIG. 19A, the excitation cable of the converter A 500a may be connected to the flowtube B 530b. At this time, as shown in FIG. 19B, when the excitation cable from the converter B 500 is connected to the flowtube A 530a, the flow rate signal detected on the basis of the excitation signal from the converter B 500b may be input to the converter A 500a.

Further, as shown in FIG. 20, the converter A 500a and the flowtube B 530b are connected to each other by the excitation cable and the signal cable and the converter B 500b and the flowtube A 530a are connected to each other by the excitation cable and the signal cable, so that the flowtubes 530a, 530b to be connected to the converter A 500a and the converter B 500b are mixed up each other.

When the miswiring occurs, it may be found in many cases because an assumed flow rate and a display value are not matched after the operation actually starts (FIG. 16: S15). In this case, the operation should be actually stopped and returned to the wiring process (S12) and the zero adjustment (S14) should be re-executed. Therefore, the time is wasted and the number of processes increases, which in turn increases the cost.

SUMMARY

Exemplary embodiments of the invention provide an electromagnetic flow meter, a miswiring detection apparatus and a miswiring detection method capable of simply detecting a miswiring of the electromagnetic flow meter.

An electromagnetic flow meter according to a first aspect of the invention comprises:

a converter comprising an excitation unit configured to generate and output an excitation signal and a flow rate signal receiving unit configured receive a flow rate signal;

a flowtube comprising a coil connected to the excitation unit through an excitation cable and an electrode connected to the flow rate signal receiving unit through a signal cable; and a miswiring detection unit configured to enable the excitation unit to output an excitation signal of a first frequency and configured to calculate a first index value relating to the first frequency and a second index value relating to a second frequency from a flow rate signal, which is acquired when the excitation signal of the first frequency is output, wherein the miswiring detection unit determines that a miswiring occurs when the first index value is not large enough to satisfy a predetermined criterion than the second index value.

The miswiring detection unit may be configured to enable the excitation unit to output an excitation signal of the second frequency when the first index value is large enough to satisfy the predetermined criterion than the second index value, and the miswiring detection unit may be configured to calculate the first index value relating to the first frequency and the second index value relating to the second frequency from a flow rate signal, which is acquired when the excitation signal of the second frequency is output, and may determine that a miswiring occurs when the calculated second index value is not large enough to satisfy a predetermined criterion than the calculated first index value, and otherwise determines that a wiring is normal.

The first index value may be a value for evaluating a magnitude of a frequency component within a predetermined range about the first frequency, and the second index value may be a value for evaluating a magnitude of a frequency component within a predetermined range about the second frequency.

An electromagnetic flow meter according to a second aspect of the invention comprises:
a converter comprising an excitation unit configured to generate and output an excitation signal and a flow rate signal receiving unit configured receive a flow rate signal;
a flowtube comprising a coil connected to the excitation unit through an excitation cable and an electrode connected to the flow rate signal receiving unit through a signal cable; and
a miswiring detection unit configured:
to enable the excitation unit to output an excitation signal of a first frequency and to calculate an index value A relating to the first frequency from a flow rate signal, which is acquired when the excitation signal of the first frequency is output, and
to enable the excitation unit to stop the output of the excitation signal of the first frequency and to calculate an index value B relating to the first frequency from a flow rate signal, which is acquired when the output of the excitation signal of the first frequency is stopped,
wherein the miswiring detection unit determines that a miswiring occurs when the index value A is not large enough to satisfy a predetermined criterion than the index value B.

A miswiring detection apparatus according to a third aspect of the invention is a miswiring detection apparatus configured to be connected to an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable,
wherein the miswiring detection apparatus is configured to calculate a first index value relating to a first frequency and a second index value relating to a second frequency from a flow rate signal, which is acquired when the excitation unit outputs an excitation signal of the first frequency, and
wherein the miswiring detection apparatus determines that a miswiring occurs when the first index value is not large enough to satisfy a predetermined criterion than the second index value.

A miswiring detection apparatus according to a fourth aspect of the invention is a miswiring detection apparatus configured to be connected to an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable,
wherein the miswiring detection apparatus is configured to calculate an index value A relating to a first frequency from a flow rate signal, which is acquired when the excitation unit outputs an excitation signal of the first frequency,
wherein the miswiring detection apparatus is configured to calculate an index value B relating to the first frequency from a flow rate signal, which is acquired when the excitation unit stops the output of the excitation signal of the first frequency, and
wherein the miswiring detection apparatus determines that a miswiring occurs when the index value A is not large enough to satisfy a predetermined criterion than the index value B.

A miswiring detection method according to a fifth aspect of the invention is a miswiring detection method in an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable, the method comprising:
outputting an excitation signal of a first frequency from the excitation unit;
calculating a first index value relating to the first frequency and a second index value relating to a second frequency from a flow rate signal, which is acquired when the excitation signal of the first frequency is output; and
determining that a miswiring occurs when the first index value is not large enough to satisfy a predetermined criterion than the second index value.

A miswiring detection method according to a sixth aspect of the invention is a miswiring detection method in an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable, the method comprising:
outputting an excitation signal of a first frequency from the excitation unit and calculating an index value A relating to the first frequency from a flow rate signal, which is acquired when the excitation signal of the first frequency is output;
stopping the output of the excitation signal of the first frequency and calculating an index value B relating to the first frequency from a flow rate signal, which is acquired when the output of the excitation signal of the first frequency is stopped; and determining that a miswiring occurs when the index value A is not large enough to satisfy a predetermined criterion than the index value B.

According to the present invention, it is possible to simply detect the miswiring of the electromagnetic flow meter.

DETAILED DESCRIPTION

Figure 1:
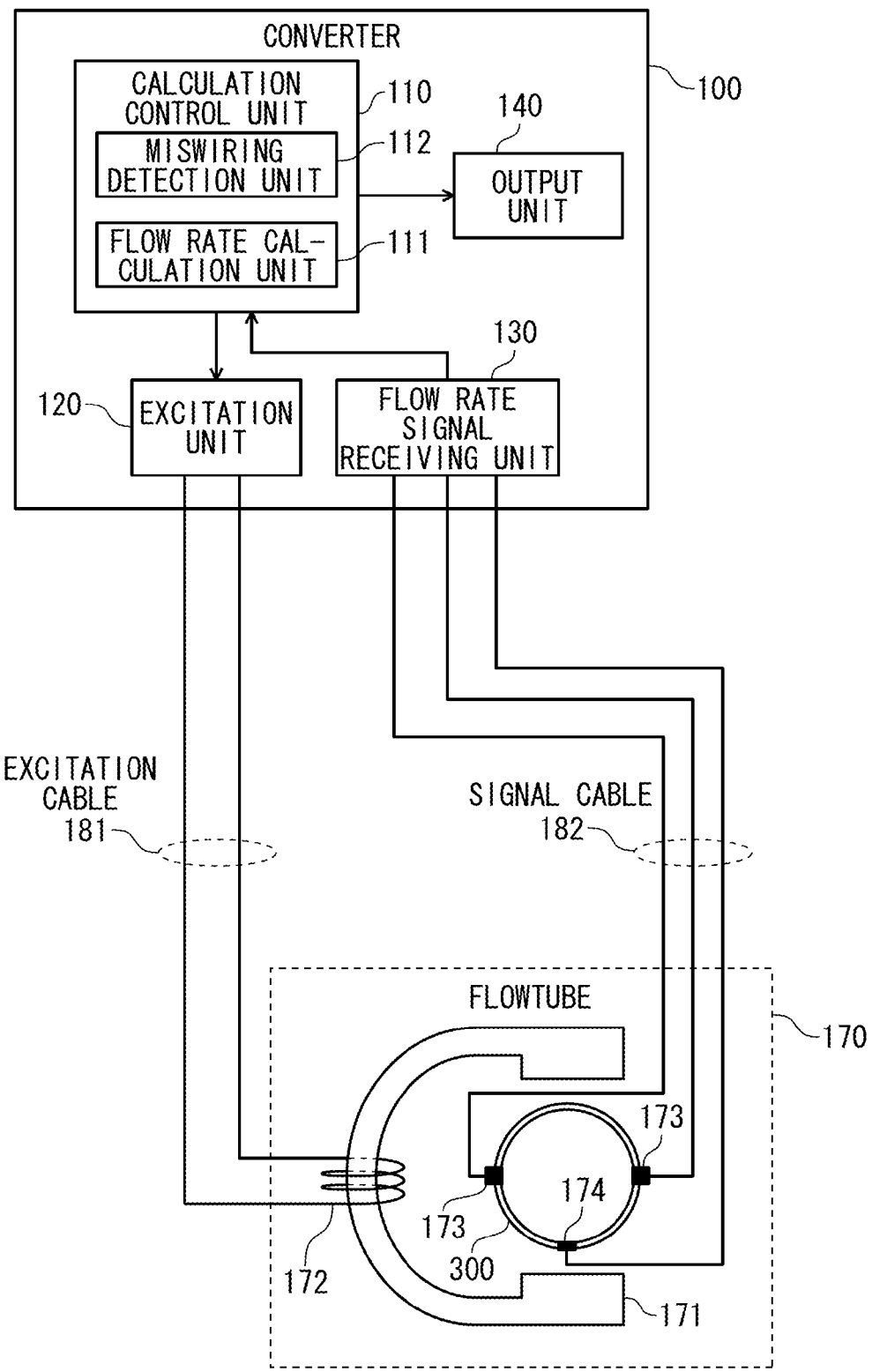
FIG. 1 is a block diagram showing a configuration of an electromagnetic flow meter according to an exemplary embodiment.

An exemplary embodiment of the present invention will be described with reference to the drawings. FIG. 1 is a block diagram showing a configuration of an electromagnetic flow meter according to an exemplary embodiment. As shown in FIG. 1, an electromagnetic flow meter 10 has a converter 100 and a flowtube 170.

The converter 100 has a calculation control unit 110 configured to control an operation of the converter, an excitation unit 120 configured to generate and output an excitation signal, a flow rate signal receiving unit 130 configured receive a flow rate signal and an output unit 140 configured to display a measurement result and the like and to transmit the same to another apparatus.

The calculation control unit 110 has a flow rate calculation unit 111 configured to calculate a flow rate on the basis of the flow rate signal and a miswiring detection unit 112 configured to detect a miswiring. A miswiring check operation of the miswiring detection unit 112 will be described later. A CPU executes firmware, so that the miswiring detection unit 112 may be implemented, for example.

The flowtube 170 has a core 171 around which a coil 172 is wound, a pair of detection electrodes 173 mounted to a piping 300 and an earth electrode 174.

The excitation signal output from the excitation unit 120 is input to the coil 172 through an excitation cable 181, and the flow rate signals from the detection electrodes 173 and earth electrode 174 are input to the flow rate signal receiving unit 130 through a signal cable 182.

Figure 2:
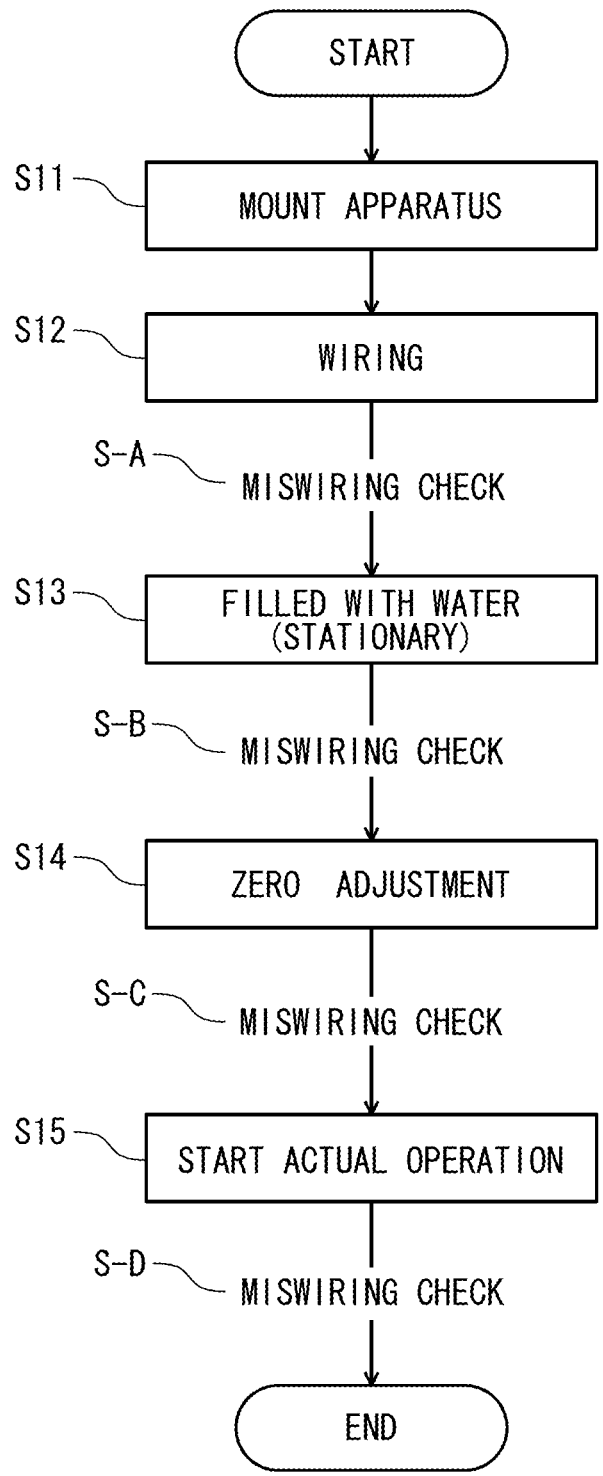
FIG. 2 is a flowchart showing execution timings of miswiring check.

In this exemplary embodiment, the miswiring detection unit 112 can perform the miswiring check operation at various timings. For example, as shown in FIG. 2, the miswiring detection unit 112 can perform the miswiring check operation at a state where the piping 300 is empty after the wiring (S12) (S-A) and can perform the miswiring check operation after the piping 300 is filled with water (S13) before zero adjustment is performed (S14) (S-B). Also, the miswiring detection unit 112 can perform the miswiring check operation after the zero adjustment (S14) (S-C) and can perform the miswiring check operation after an operation actually starts (S15) (S-D).

At a state where the piping is empty, the miswiring detection precision may be deteriorated. Also, in order to avoid re-execution of the zero adjustment (S14) when the miswiring is detected, it is preferably to perform the miswiring check operation after the piping 300 is filled with water (S13) before the zero adjustment is performed (S14) (S-B). To this end, the electromagnetic flow meter 10 having received an instruction of the zero adjustment may be configured to automatically perform the miswiring check operation before the zero adjustment operation.

Figure 3:
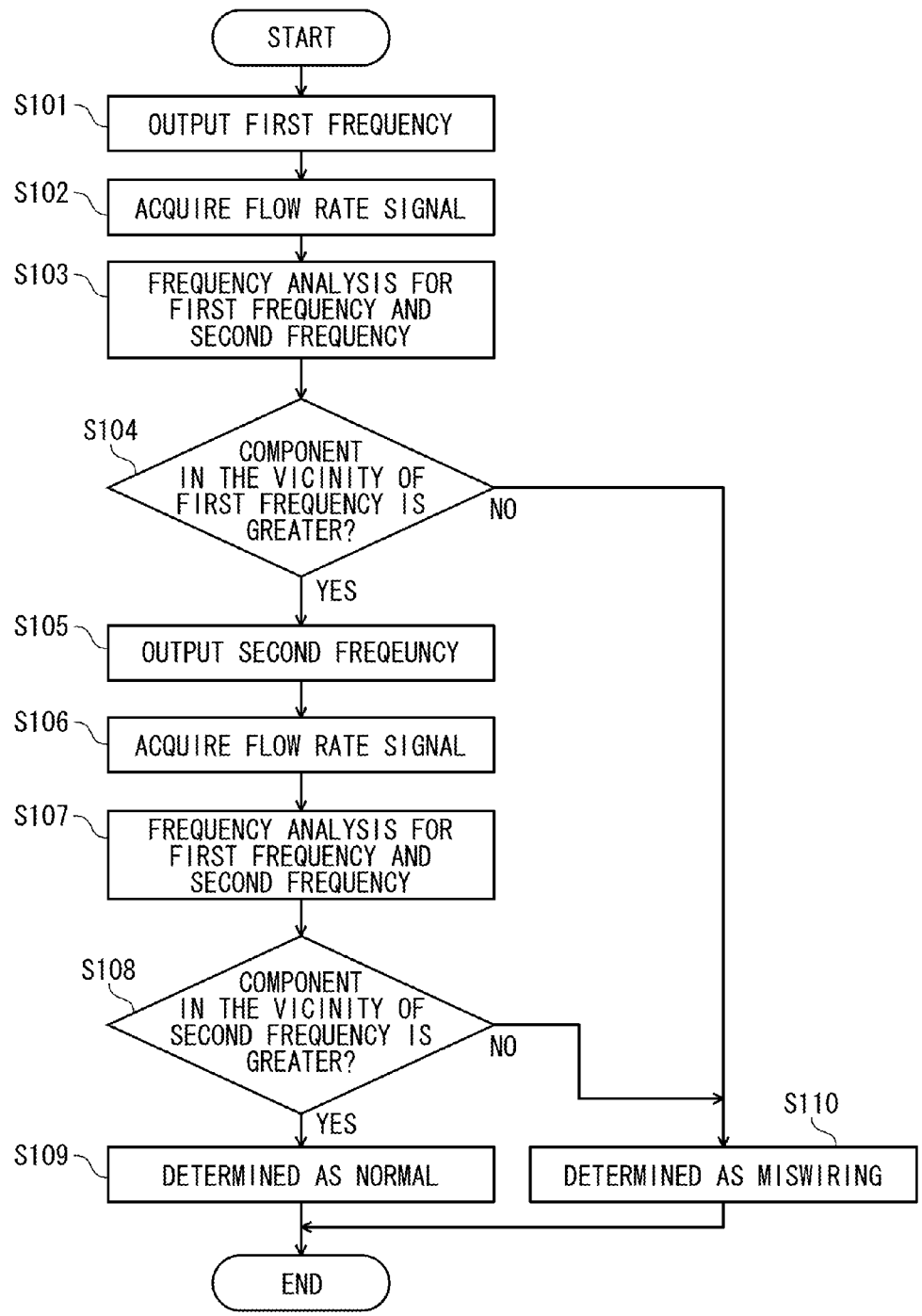
FIG. 3 is a flowchart showing a sequence of the miswiring check.

FIG. 3 is a flowchart showing the miswiring check operation of this exemplary embodiment. The operation is performed under control of the miswiring detection unit 112. As described above, the miswiring check operation may be automatically performed before the zero adjustment or may be performed at any timing by an instruction of a user. Alternatively, the miswiring check operation may be performed every activation or may be performed by an instruction from another apparatus through communication.

In the miswiring check operation, two different frequencies are used as the excitation signal. Here, one frequency is referred to as a first frequency and the other frequency is referred to as a second frequency. In general, in the electromagnetic flow meter, an alternating current signal of a predetermined frequency (a normal alternating current signal) is used as an excitation signal so as to measure a flow rate of fluid to be measured. The two frequencies used for the miswiring check are preferably different from the frequency of the normal alternating current signal. However, any one frequency may be the same as the frequency of the normal alternating current signal.

First, the miswiring detection unit 112 enables the excitation unit 120 to output an excitation signal of the first frequency (S101). Then, the miswiring detection unit 112 acquires a flow rate signal through the flow rate signal receiving unit 130 (S102).

In the electromagnetic flow meter, a differential noise proportional to a change in a magnetic flux occurs in the flow rate signal. The differential noise securely occurs irrespective of whether the water stops or flows, if the piping 300 is filled with water. Also, the differential noise occurs to some extent even if the piping 300 is empty.

Figure 4:
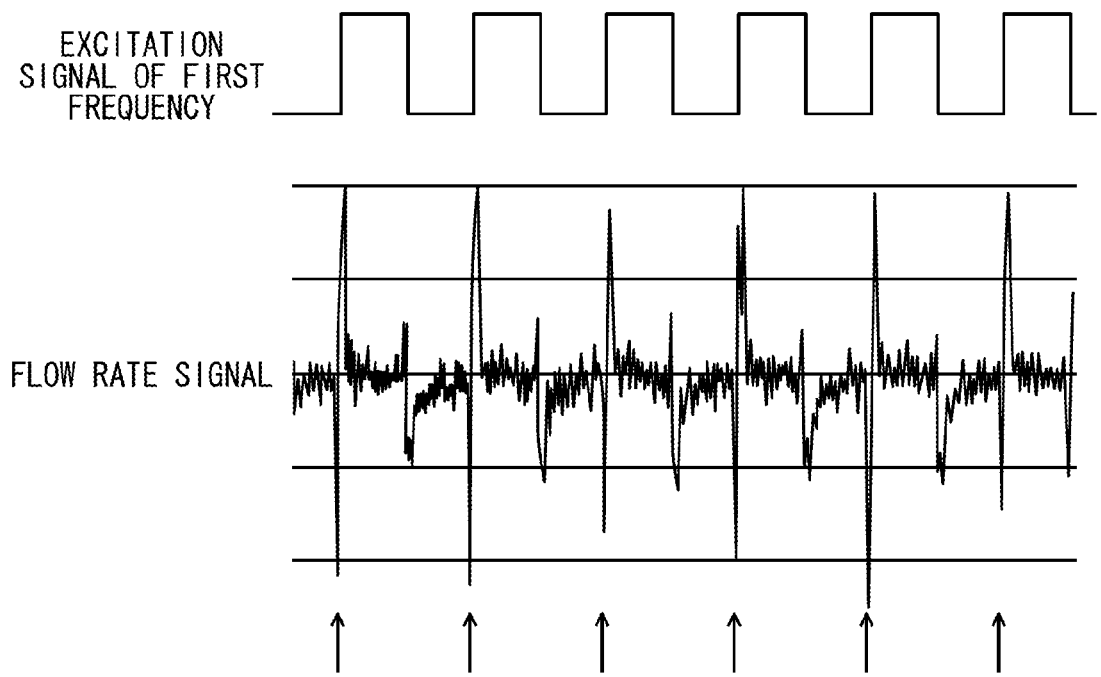
FIG. 4 illustrates a relation between an excitation signal of a first frequency and a flow rate signal for a normal wiring.
Figure 5:
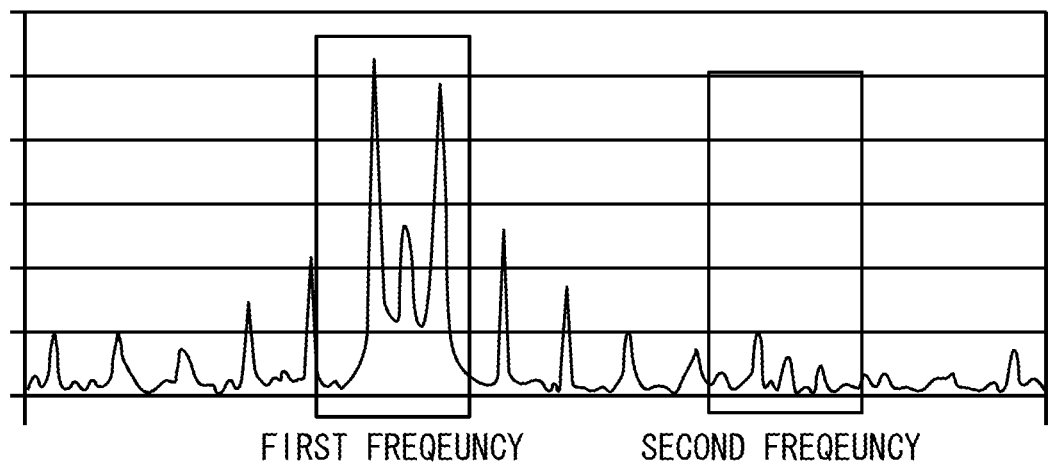
FIG. 5 illustrates a frequency analysis result for the normal wiring.
Figure 17:
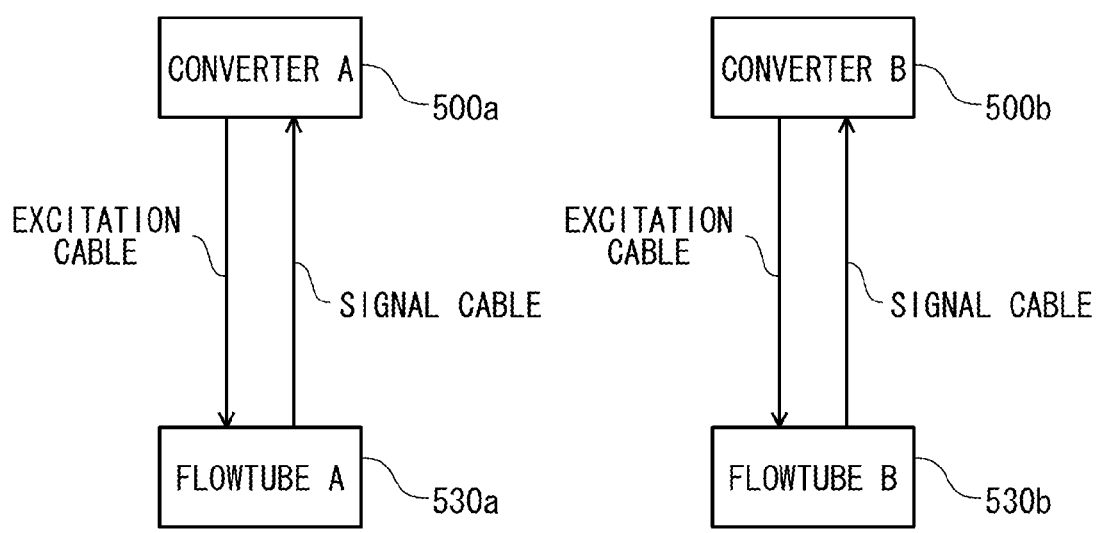
FIG. 17 illustrates a normal wiring state of the electromagnetic flow meter.

For this reason, when the wiring is normal, as shown in FIG. 17, the differential noise (a waveform denoted with an arrow in FIG. 4) occurs at the first frequency in the flow rate signal to the excitation signal of the first frequency, as shown in FIG. 4, and a distribution of frequency components (a magnitude of the flow rate signal at each frequency) as shown in FIG. 5 is obtained. That is, the components in the vicinity of the first frequency become strong and the components in the vicinity of the second frequency are not strong.

Figure 6:
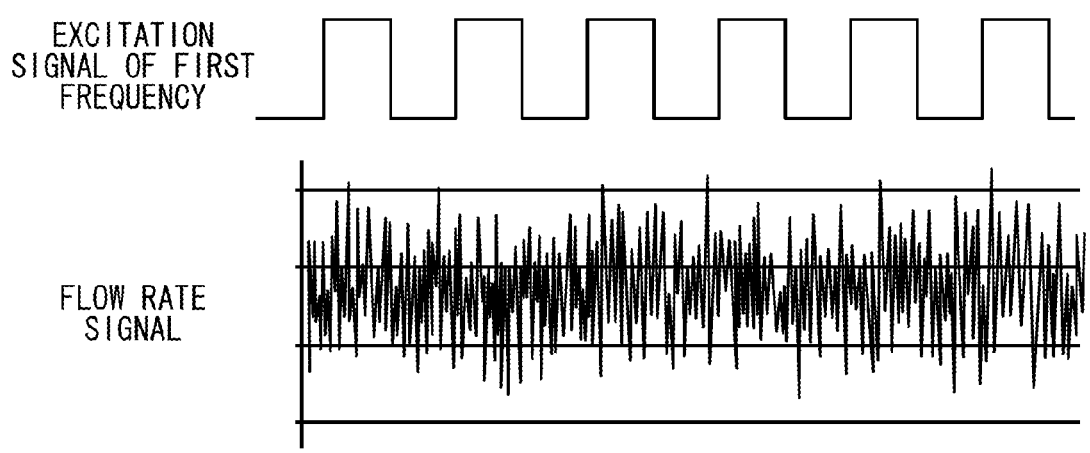
FIG. 6 illustrates a relation between an excitation signal and a flow rate signal for a miswiring.
Figure 7:
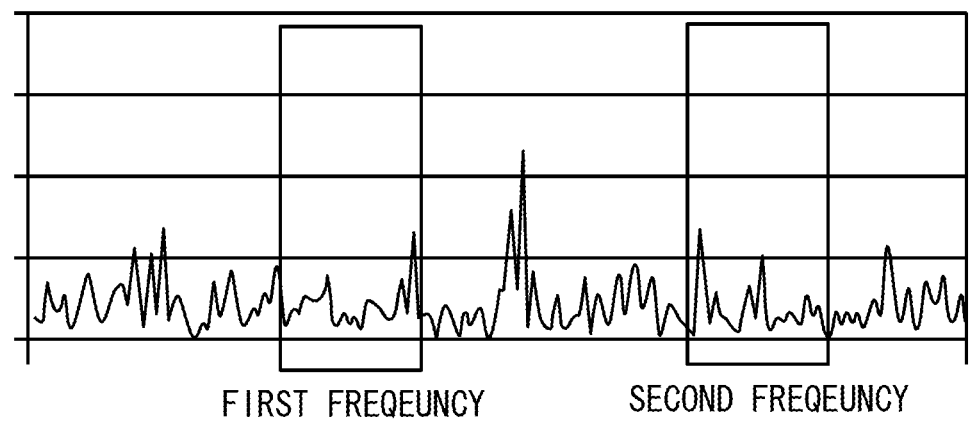
FIG. 7 illustrates a frequency analysis result for the miswiring.

In the meantime, when the miswiring as shown in FIGS. 18A, 18B, 19A, 19B and 20 occurs and the excitation signal is not input to the flowtube 170 or the flow rate signal is not input to the converter 100, the differential noise does not occur in the flow rate signal even though the excitation signal of the first frequency is output from the excitation unit 120, as shown in FIG. 6. For this reason, both the components in the vicinity of the first frequency and the components in the vicinity of the second frequency are not strong, as shown in FIG. 7.

Back to FIG. 3, the miswiring detection unit 112 analyzes the frequency of the flow rate signal to calculate a first index value indicating a magnitude of a component in the vicinity of the first frequency and a second index value indicating a magnitude of a component in the vicinity of the second frequency (S103). For the frequency analysis, an FFT (Fast Fourier Transformation), a DFT (Discrete Fourier Transformation) and the like may be used.

The first index value may be set as a maximum value of a range of the first frequency ±10 Hz, an average value of the range of the first frequency ±10 Hz, and the like. The second index value may be set in the same manner. In the meantime, the first frequency and the second frequency are set so that an evaluation range of the first index value and an evaluation range of the second index value do not overlap with each other.

When the first index value is not large enough to satisfy a predetermined criterion than the second index value (S104: No), the differential noise of the first frequency does not occur. Thus, it is determined that a miswiring occurs (S110). The predetermined criterion may be set as three times, for example. The criterion may be appropriately set depending on situations such as a tube diameter, a measurement method and the like.

When the miswiring detection unit 112 determines that the miswiring occurs, it issues a warning to a user or another apparatus through the output unit 140. Thereby, the user can rapidly repair the miswiring.

Figure 18A:
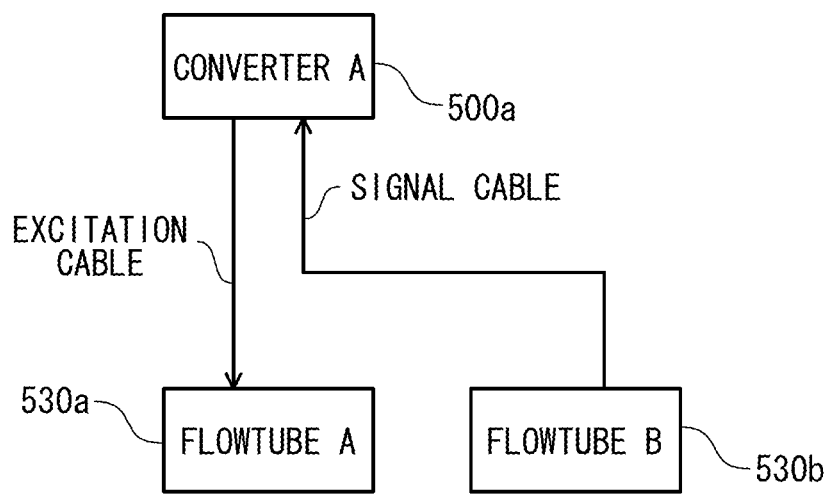
FIGS. 18A and 18B illustrate an example of a miswiring of the electromagnetic flow meter.
Figure 18B:
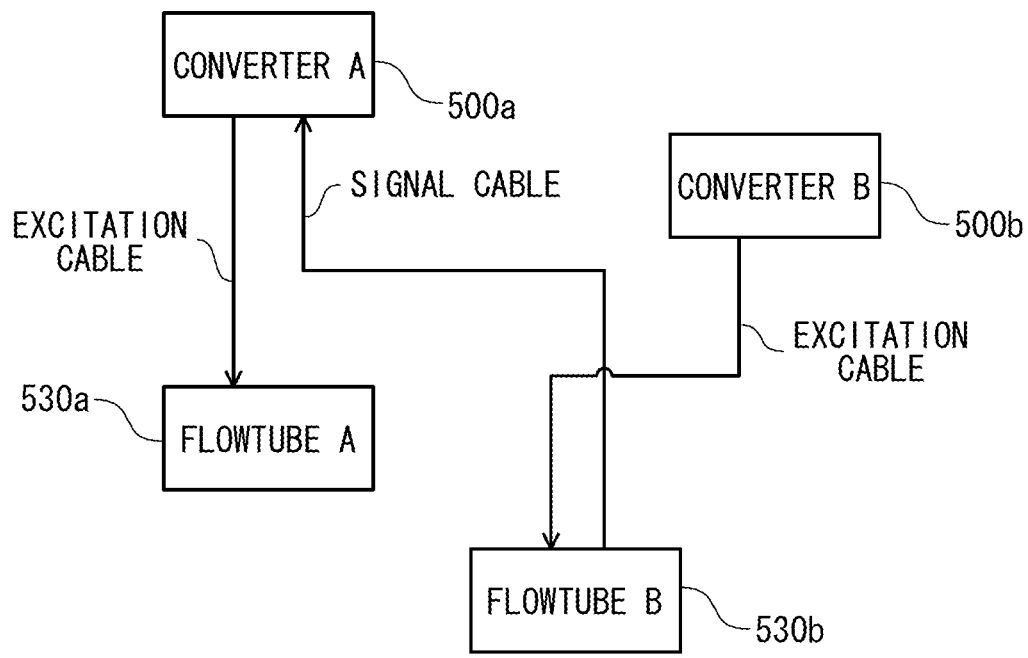
Figure 19A:
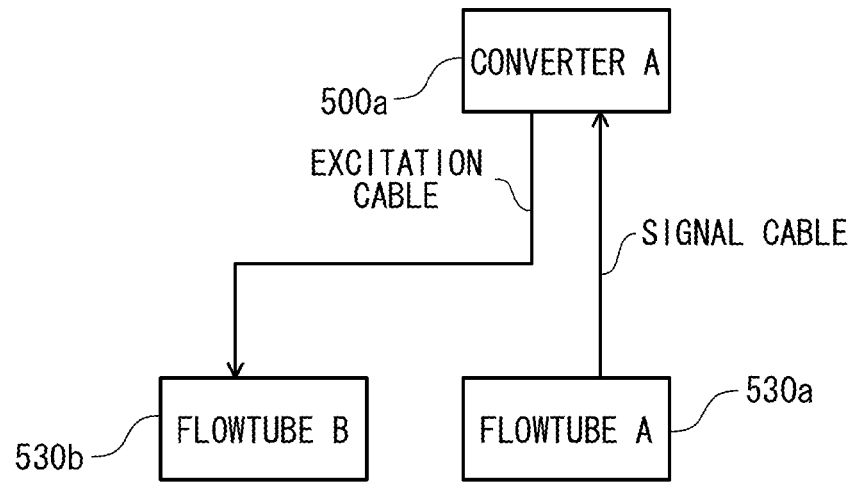
FIGS. 19A and 19B illustrate an example of a miswiring of the electromagnetic flow meter.
Figure 19B:
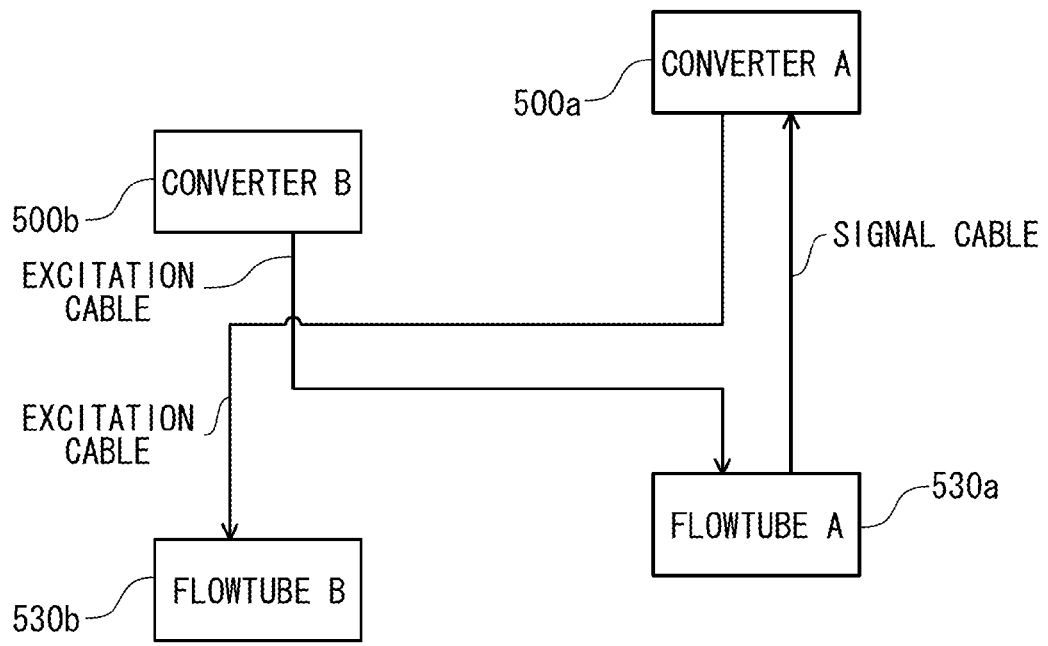
Figure 20:
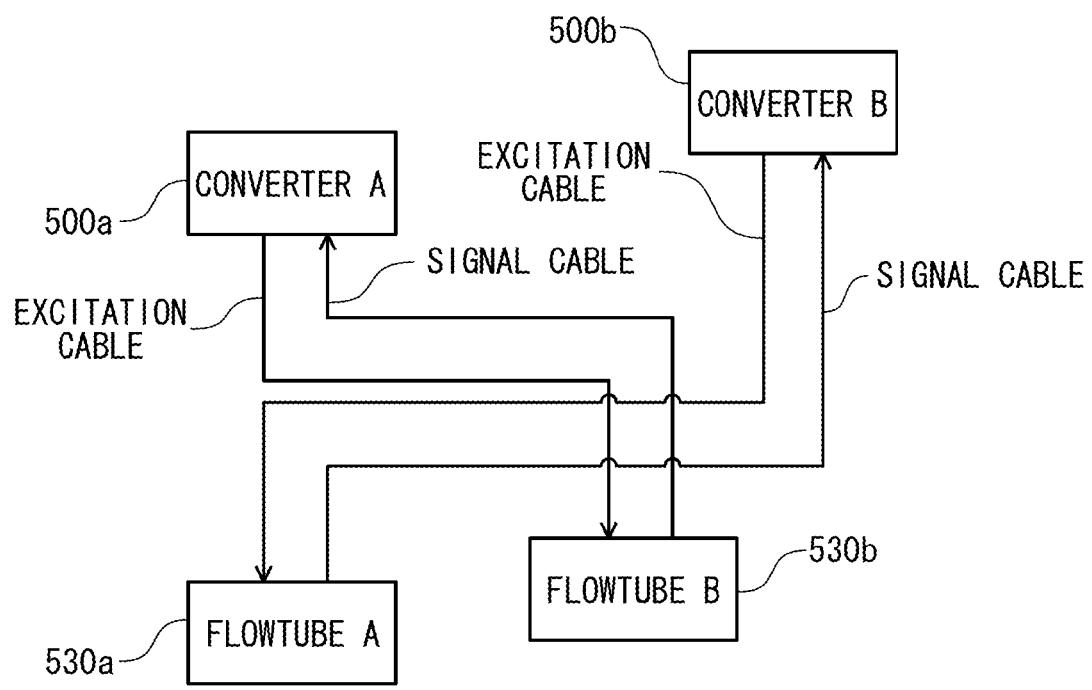
FIG. 20 illustrates an example of a miswiring of the electromagnetic flow meter.

In the meantime, even though the miswiring occurs, when a flow rate signal is input from another flowtube, as shown in FIG. 18B, or when an excitation signal of another converter is input, as shown in FIG. 19B, for example, the flow rate signal having the differential noise of the first frequency as shown in FIG. 4 may be obtained.

For this reason, when the miswiring is not detected at the first frequency, the miswiring detection unit 112 performs the same check by using the second frequency different from the first frequency. The miswiring detection unit 112 determines that the wiring is normal when the miswiring is not detected both at the first and second frequencies.

Figure 8:
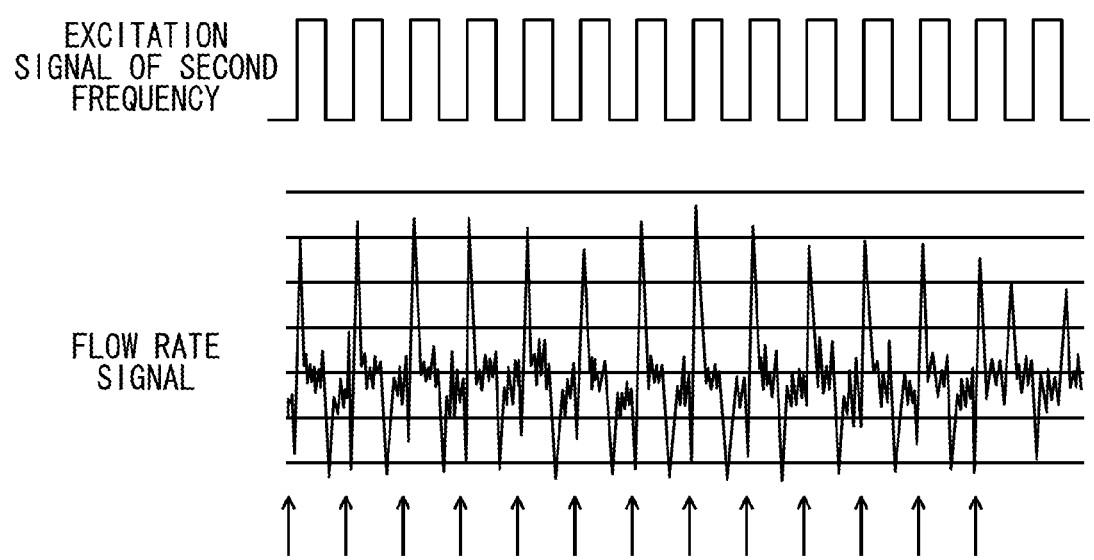
FIG. 8 illustrates a relation between an excitation signal of a second frequency and a flow rate signal for a normal wiring.
Figure 9:
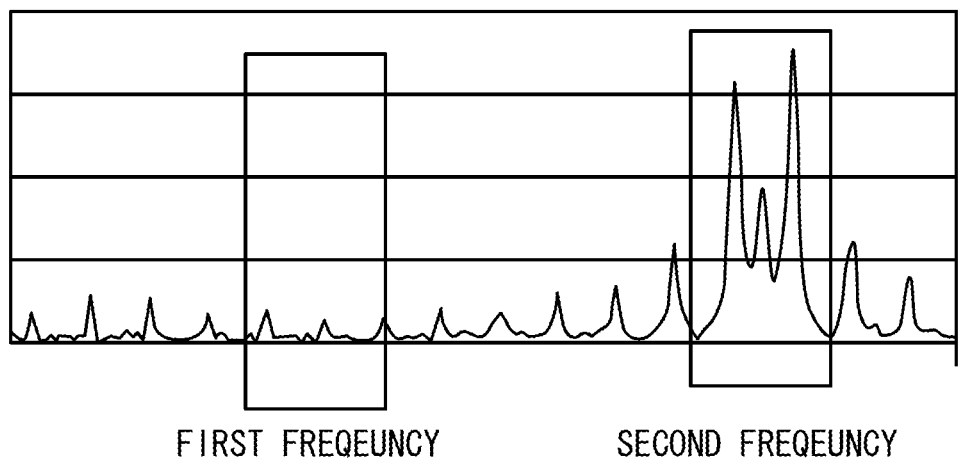
FIG. 9 illustrates a frequency analysis result for the normal wiring.

Thus, the miswiring detection unit 112 enables the excitation unit 120 to output an excitation signal of the second frequency (S105). Then, the miswiring detection unit 112 acquires a flow rate signal through the flow rate signal receiving unit 130 (S106). When the wiring is normal, a differential noise (a waveform denoted with an arrow in FIG. 8) occurs at the second frequency in the flow rate signal to the excitation signal of the second frequency, as shown in FIG. 8, and a distribution of frequency components as shown in FIG. 9 is obtained. That is, the components in the vicinity of the second frequency become strong and the components in the vicinity of the first frequency are not strong.

Back to FIG. 3, the miswiring detection unit 112 analyzes the frequency of the flow rate signal to calculate the first and second index values (S107).

When the second index value is not large enough to satisfy a predetermined criterion than the first index value (S108: No), the miswiring detection unit 112 determines that a miswiring occurs (S110). The predetermined criterion may also be appropriately set depending on the situations.

On the other hand, when the second index value is large enough to satisfy the predetermined criterion than the first index value (S108: Yes), the miswiring detection unit 112 determines that the wiring is normal, because the miswiring is not detected both at the first and second frequencies (S109).

Figure 10:
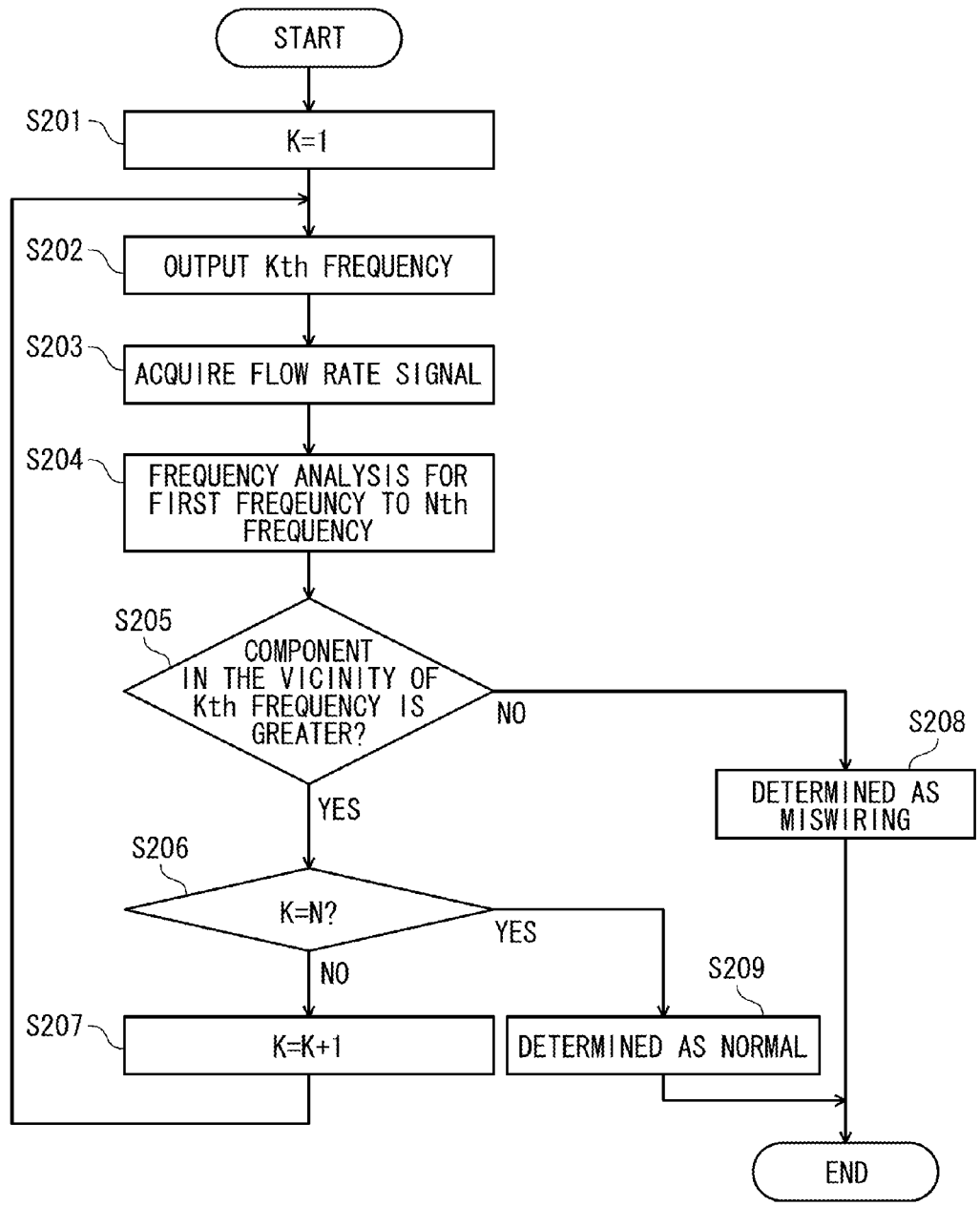
FIG. 10 is a flowchart showing a sequence of miswiring check using N frequencies.

In the above descriptions, the miswiring is checked using the two frequencies of the first frequency and the second frequency. However, in order to increase the detection precision, the miswiring may be checked using three or more frequencies. FIG. 10 is a flowchart showing an operation of performing the miswiring check by using N frequencies (a first frequency to an $N^{th}$ frequency).

In this case, a parameter K is set to an initial value '1' (S201) and an excitation signal of a $K^{th}$ frequency is input (S202). Then, a flow rate signal is acquired (S203) and the index values indicating magnitudes of components in the vicinity of each of the first frequency to the $N^{th}$ frequency are calculated by the frequency analysis (S204).

As a result, when there is an index value of another frequency large enough to satisfy a predetermined criterion than an index value indicating a magnitude of a component in the vicinity of the $K^{th}$ frequency (S205: No), it is determined that the miswiring occurs (S208).

On the other hand, when the index value indicating a magnitude of a component in the vicinity of the $K^{th}$ frequency is large enough to satisfy the predetermined criterion than the index values of the other frequencies (S205: Yes), K is incremented by 1 (K=K+1) (S207) and the same processing is repeated.

When K becomes N (K=N) and the miswiring is not detected at any frequency (S206: Yes), it is determined that the wiring is normal (S209).

Figure 11:
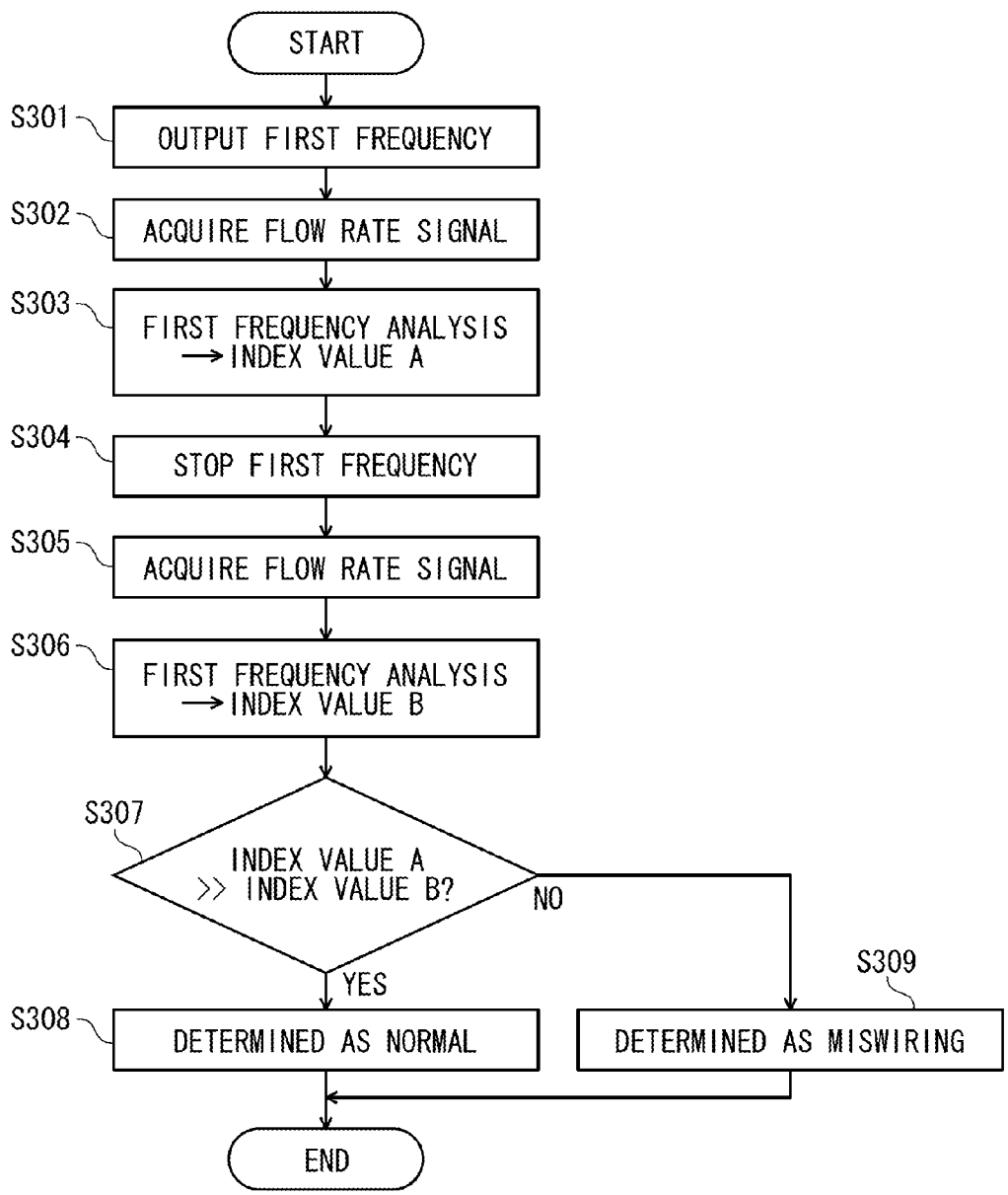
FIG. 11 is a flowchart showing a sequence of the miswiring check using only a first frequency.

Also, the miswiring check may be performed using only the first frequency. FIG. 11 is a flowchart showing an operation of performing the miswiring check using only the first frequency.

First, the miswiring detection unit 112 enables the excitation unit 120 to output an excitation signal of the first frequency (S301). Then, the miswiring detection unit 112 acquires a flow rate signal through the flow rate signal receiving unit 130 (S302).

The miswiring detection unit 112 analyzes the frequency of the flow rate signal to calculate a first index value and sets the same as an index value A (S303). An index value indicating a magnitude of a component in the vicinity of the first frequency may be set as a maximum value of a range of the first frequency ±10 Hz, an average value of the range of the first frequency ±10 Hz, and the like.

Then, the miswiring detection unit 112 stops the output of the excitation signal of the first frequency (S304) and acquires a flow rate signal through the flow rate signal receiving unit 130 (S305). Then, the miswiring detection unit 112 analyzes the frequency of the flow rate signal to calculate an index value indicating a magnitude of a component in the vicinity of the first frequency and sets the same as an index value B (S306).

Figure 12A:
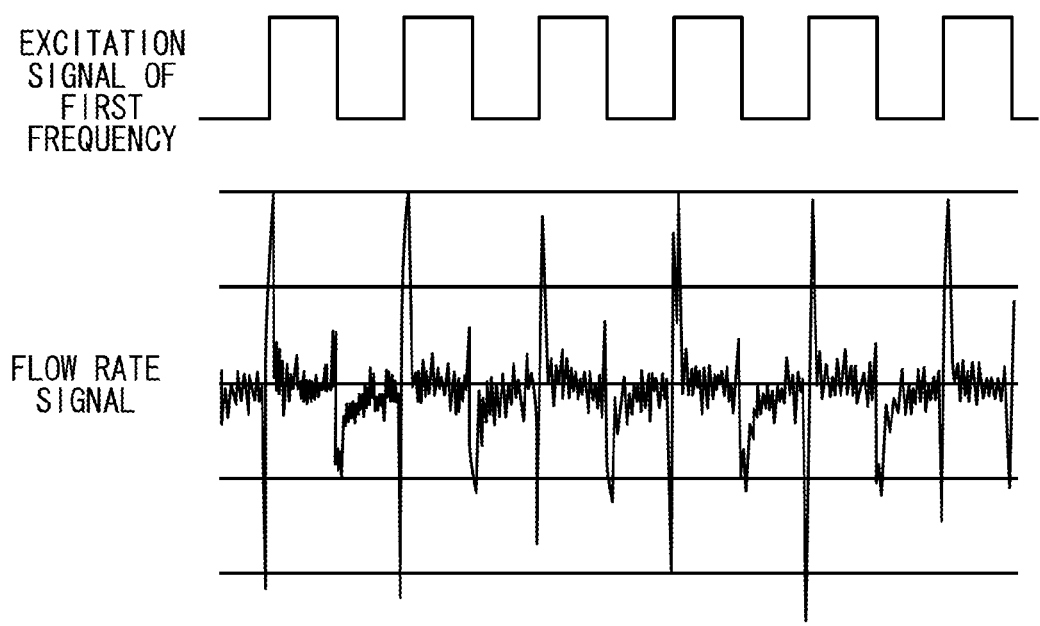
FIGS. 12A and 12B illustrate a relation between an excitation signal of a first frequency and a flow rate signal for a normal wiring.
Figure 12B:
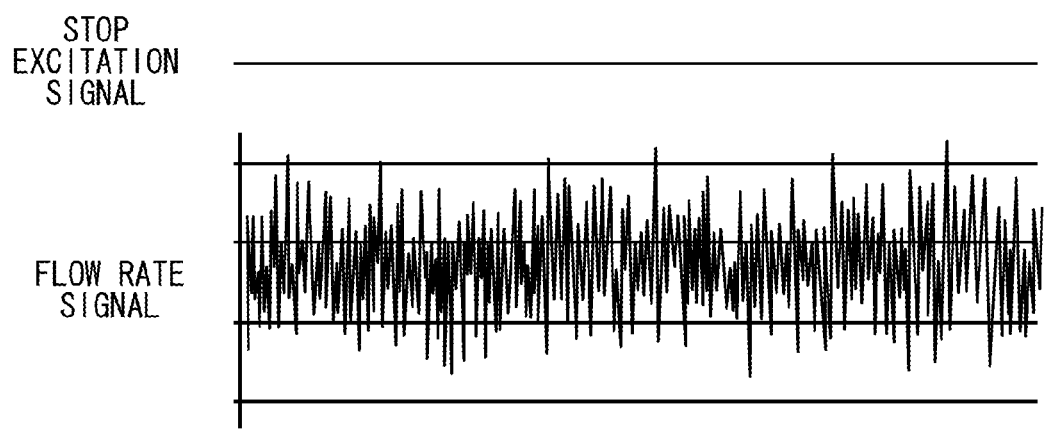

When the wiring is normal, the differential noise occurs at the first frequency in the flow rate signal, which is acquired when the excitation signal of the first frequency is output, and a waveform as shown in FIG. 12A is obtained. The differential noise occurring at the first frequency disappears in the flow rate signal, which is obtained when the output of the excitation signal of the first frequency is stopped, and a waveform as shown in FIG. 12B is obtained.

For this reason, when the index value A is large enough to satisfy a predetermined criterion than the index value B (S307: Yes), the miswiring detection unit 112 determines that the wiring is normal (S308), and when the index value A is not large enough to satisfy the predetermined criterion than the index value B (S307: No), the miswiring detection unit 112 determines that the miswiring occurs (S309).

Figure 13:
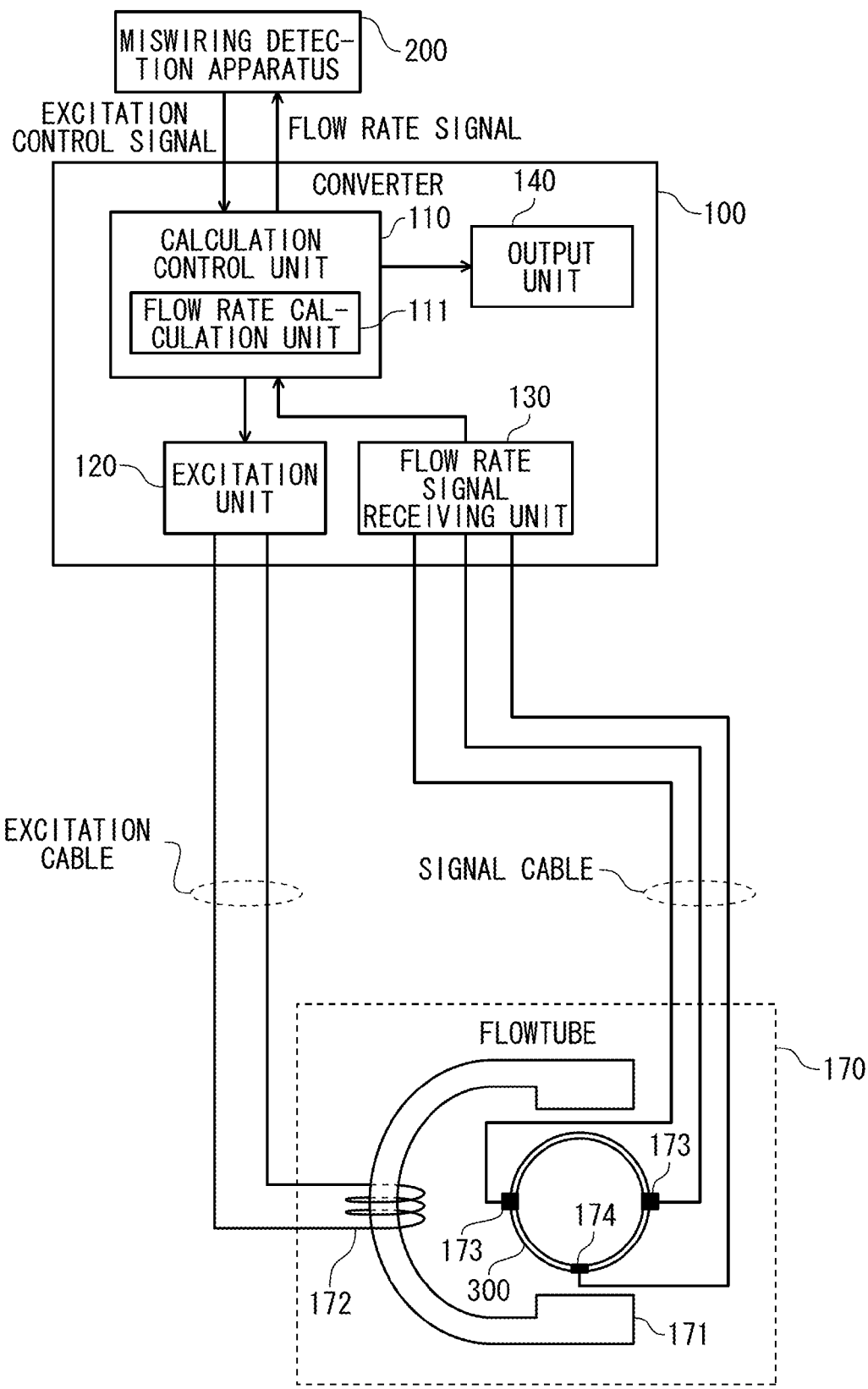
FIG. 13 is a block diagram showing a configuration of an electromagnetic flow meter and a miswiring detection apparatus.

In the above exemplary embodiment, the functional unit configured to detect a miswiring is provided in the converter 100 of the electromagnetic flow meter 10. However, the functional unit configured to detect a miswiring may be configured as an independent apparatus of the electromagnetic flow meter 10. For example, as shown in FIG. 13, a miswiring detection apparatus 200 having the same miswiring detection function as the miswiring detection unit 112 may be connected to the electromagnetic flow meter 10 and enabled to operate, thereby detecting a miswiring.

In this case, the miswiring detection apparatus 200 may transmit an instruction to the calculation control unit 110 of the converter 100 so that the calculation control unit 110 enables the excitation unit 120 to output an excitation signal of the first frequency or second frequency at predetermined timing and may acquire a flow rate signal from the calculation control unit 110. Thereby, the miswiring detection apparatus 200 can perform the miswiring check in accordance with the above-described sequence. At this time, an index value after the frequency analysis may be acquired from the calculation control unit 110, instead of the flow rate signal. Alternatively, the miswiring detection apparatus 200 may perform the miswiring check by outputting an excitation signal of the first frequency and then stopping the same, as described with reference to FIG. 11.

Figure 14:
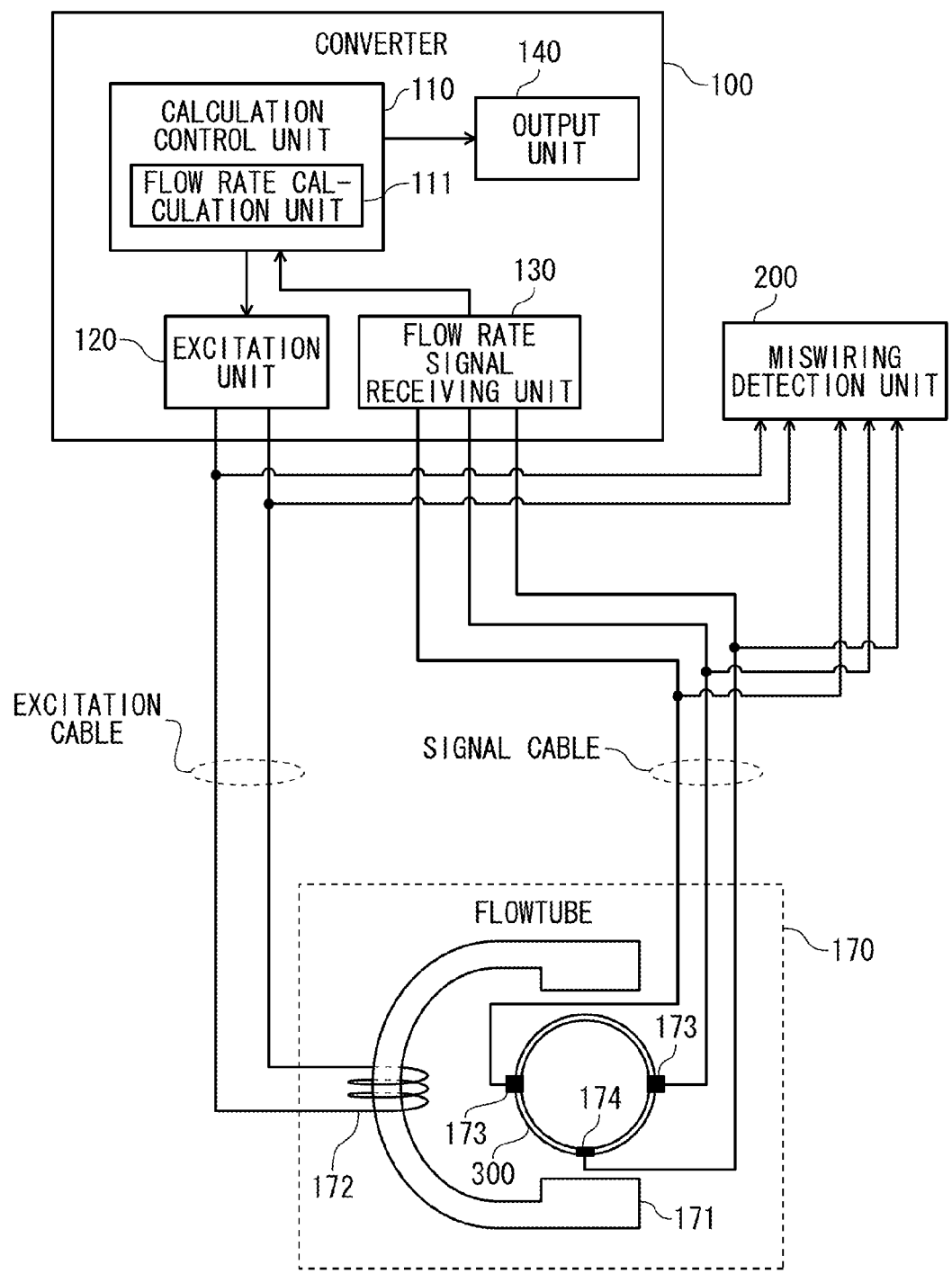
FIG. 14 is a block diagram showing another configuration of an electromagnetic flow meter and a miswiring detection apparatus.
Figure 15:
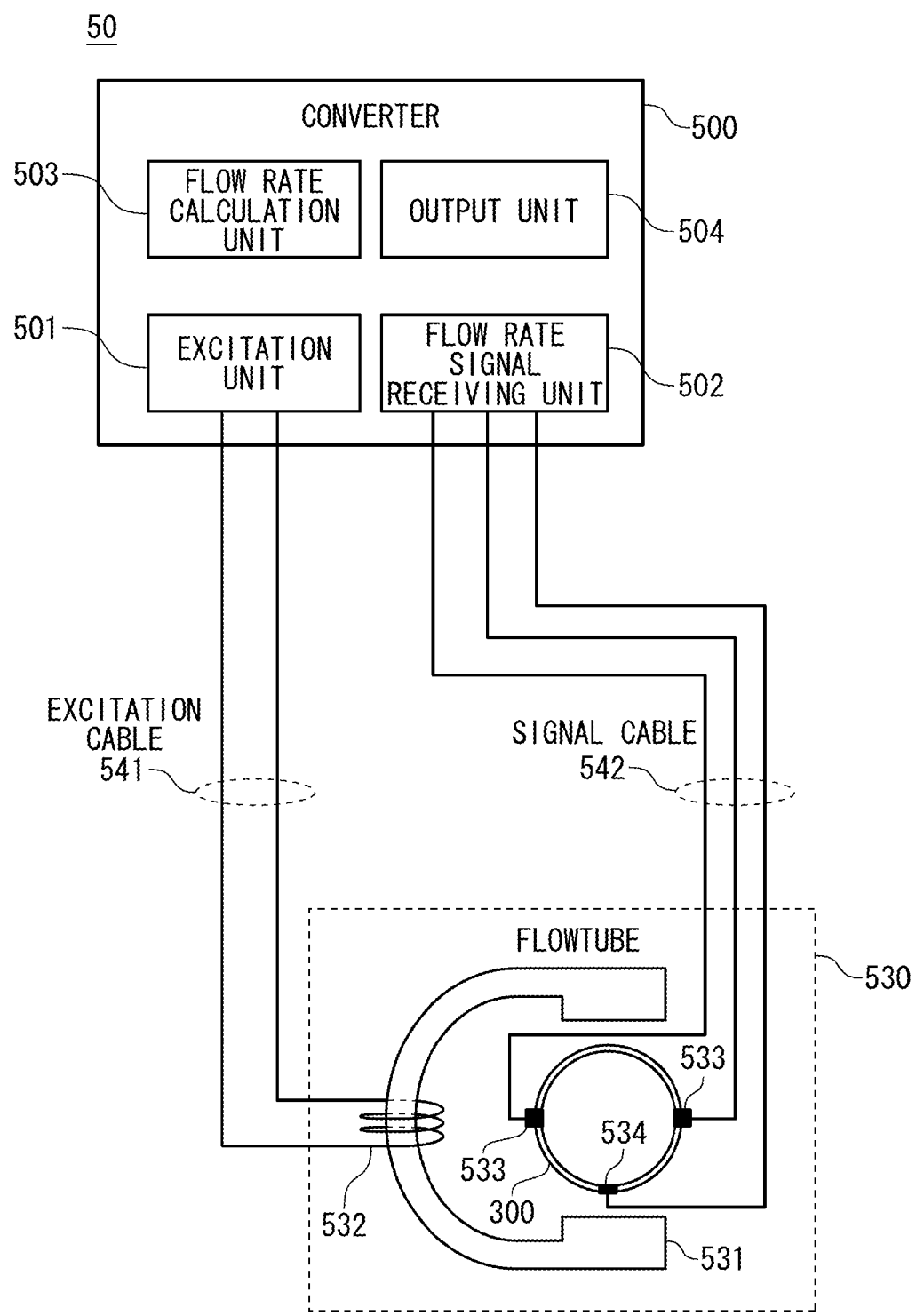
FIG. 15 is a block diagram showing a configuration of an electromagnetic flow meter of the related art.
Figure 16:
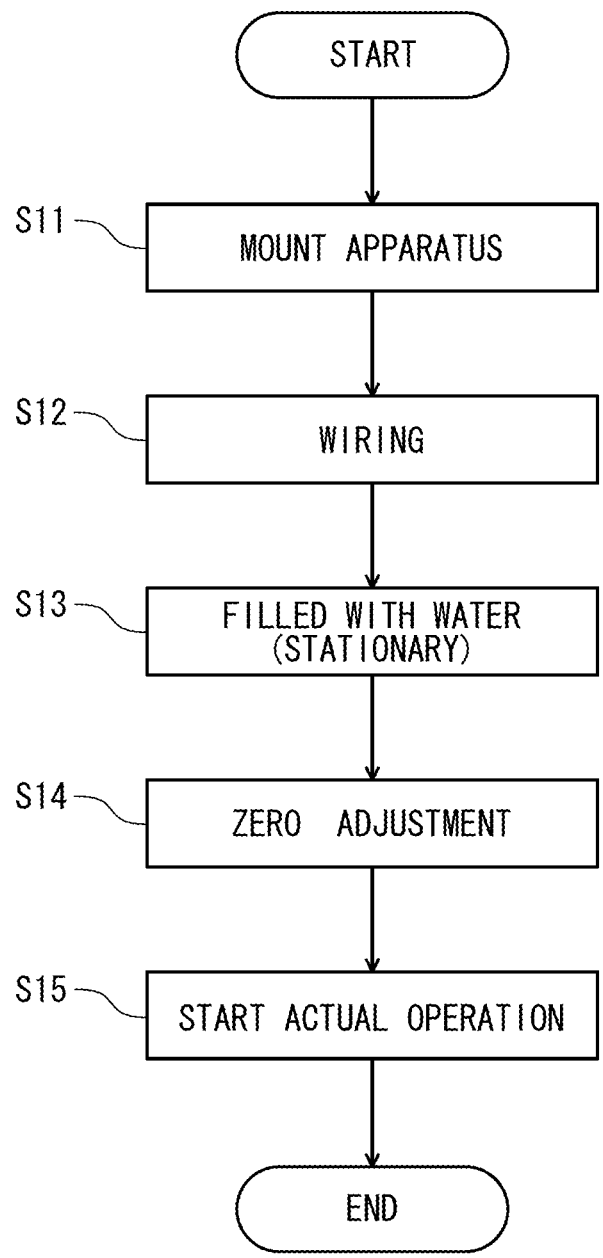
FIG. 16 is a flowchart showing a sequence of mounting the electromagnetic flow meter.

Also, as shown in FIG. 14, the miswiring detection apparatus 200 may acquire an excitation signal from the excitation cable connected to the excitation unit 120 and acquire a flow rate signal from the signal cable connected to the flow rate signal receiving unit 130, thereby checking the miswiring.

In this case, a miswiring check mode in which the excitation unit 120 is enabled to output an excitation signal of the first or second frequency at predetermined timing may be provided and executed when the miswiring detection apparatus 200 performs the miswiring check. Alternatively, a miswiring check mode in which the excitation unit 120 is enabled to output an excitation signal of the first frequency and then to stop the same may be provided and executed when the miswiring detection apparatus 200 performs the miswiring check.

Also, the present invention can be applied to a field device, an analysis apparatus and the like configured to output an excitation signal and to perform measurement by using a sensor signal corresponding to the excitation signal, in addition to the electromagnetic flow meter. For example, the apparatus may include a Corioli mass flow meter, an oscillating differential-pressure meter, and the like.

What is claimed is:

1. An electromagnetic flow meter comprising:
   a converter comprising an excitation unit configured to generate and output an excitation signal and a flow rate signal receiving unit configured receive a flow rate signal;
   a flowtube comprising a coil connected to the excitation unit through an excitation cable and an electrode connected to the flow rate signal receiving unit through a signal cable; and
   a miswiring detection unit configured to enable the excitation unit to output an excitation signal of a first frequency and configured to calculate a first index value relating to the first frequency and a second index value relating to a second frequency from a flow rate signal, which is acquired when the excitation signal of the first frequency is output,
   wherein the miswiring detection unit determines that a miswiring occurs when the first index value is not large enough to satisfy a predetermined criterion than the second index value.

2. The electromagnetic flow meter according to claim 1, wherein the miswiring detection unit is configured to enable the excitation unit to output an excitation signal of the second frequency when the first index value is large enough to satisfy the predetermined criterion than the second index value, and
   wherein the miswiring detection unit is configured to calculate the first index value relating to the first frequency and the second index value relating to the second frequency from a flow rate signal, which is acquired when the excitation signal of the second frequency is output, and determines that a miswiring occurs when the calculated second index value is not large enough to satisfy a predetermined criterion than the calculated first index value, and otherwise determines that a wiring is normal.

3. The electromagnetic flow meter according to claim 1, wherein the first index value is a value for evaluating a magnitude of a frequency component within a predetermined range about the first frequency, and
   wherein the second index value is a value for evaluating a magnitude of a frequency component within a predetermined range about the second frequency.

4. An electromagnetic flow meter comprising:
   a converter comprising an excitation unit configured to generate and output an excitation signal and a flow rate signal receiving unit configured receive a flow rate signal;
   a flowtube comprising a coil connected to the excitation unit through an excitation cable and an electrode connected to the flow rate signal receiving unit through a signal cable; and
   a miswiring detection unit configured:
   to enable the excitation unit to output an excitation signal of a first frequency and to calculate an index value A relating to the first frequency from a flow rate signal, which is acquired when the excitation signal of the first frequency is output, and
   to enable the excitation unit to stop the output of the excitation signal of the first frequency and to calculate an index value B relating to the first frequency from a flow rate signal, which is acquired when the output of the excitation signal of the first frequency is stopped,
   wherein the miswiring detection unit determines that a miswiring occurs when the index value A is not large enough to satisfy a predetermined criterion than the index value B.

5. A miswiring detection apparatus configured to be connected to an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable,
- wherein the miswiring detection apparatus is configured to calculate a first index value relating to a first frequency and a second index value relating to a second frequency from a flow rate signal, which is acquired when the excitation unit outputs an excitation signal of the first frequency, and
- wherein the miswiring detection apparatus determines that a miswiring occurs when the first index value is not large enough to satisfy a predetermined criterion than the second index value.

6. A miswiring detection apparatus configured to be connected to an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable,
- wherein the miswiring detection apparatus is configured to calculate an index value A relating to a first frequency from a flow rate signal, which is acquired when the excitation unit outputs an excitation signal of the first frequency,
- wherein the miswiring detection apparatus is configured to calculate an index value B relating to the first frequency from a flow rate signal, which is acquired when the excitation unit stops the output of the excitation signal of the first frequency, and
- wherein the miswiring detection apparatus determines that a miswiring occurs when the index value A is not large enough to satisfy a predetermined criterion than the index value B.

7. A miswiring detection method in an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable, the method comprising:
- outputting an excitation signal of a first frequency from the excitation unit;
- calculating a first index value relating to the first frequency and a second index value relating to a second frequency from a flow rate signal, which is acquired when the excitation signal of the first frequency is output; and
- determining that a miswiring occurs when the first index value is not large enough to satisfy a predetermined criterion than the second index value.

8. A miswiring detection method in an electromagnetic flow meter, the electromagnetic flow meter comprising a converter comprising an excitation unit configured to generate and output an excitation signal and a flow rate signal receiving unit configured receive a flow rate signal, and a flowtube comprising a coil connected to the excitation unit through an excitation cable and an electrode connected to the flow rate signal receiving unit through a signal cable, the method comprising:
- outputting an excitation signal of a first frequency from the excitation unit and calculating an index value A relating to the first frequency from a flow rate signal, which is acquired when the excitation signal of the first frequency is output;
- stopping the output of the excitation signal of the first frequency and calculating an index value B relating to the first frequency from a flow rate signal, which is acquired when the output of the excitation signal of the first frequency is stopped; and
- determining that a miswiring occurs when the index value A is not large enough to satisfy a predetermined criterion than the index value B.

* * * * *